United States Patent
Onishi

(10) Patent No.: US 7,813,403 B2
(45) Date of Patent: Oct. 12, 2010

(54) VERTICAL CAVITY SURFACE EMITTING LASER DIODE AND A METHOD FOR PRODUCING THE SAME

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 103 days.

(21) Appl. No.: 12/232,677

(22) Filed: Sep. 22, 2008

(65) Prior Publication Data

US 2009/0097518 A1    Apr. 16, 2009

(30) Foreign Application Priority Data

Sep. 27, 2007   (JP) ............................... 2007-252315

(51) Int. Cl.
*H01S 5/00* (2006.01)

(52) U.S. Cl. ............................... 372/46.015; 372/46.01; 372/50.124

(58) Field of Classification Search ............ 372/46.015, 372/46.01, 50.124

See application file for complete search history.

(56) References Cited

U.S. PATENT DOCUMENTS 5,513,202 A * 4/1996 Kobayashi et al. ............ 372/96
2009/0141766 A1* 6/2009 Onishi ..................... 372/50.11

OTHER PUBLICATIONS

Lear et al., "High Power Conversion Efficiencies and Scaling Issues . . . Lasers", IEEE Photonics Technology Letters, vol. 6, No. 7, Jul. 1994, pp. 778-781.

* cited by examiner

*Primary Examiner*—Minsun Harvey
*Assistant Examiner*—Kinam Park
(74) *Attorney, Agent, or Firm*—Smith, Gambrell & Russell, LLP

(57) ABSTRACT

A vertical cavity surface emitting laser diode (VCSEL) with a new structure is disclosed. The VCSEL of the invention provides the active layer, the first spacer layer, the tunnel junction, the second spacer layer burying the tunnel junction. Only the first spacer layer is ion-implanted to form a high-resistive region around the tunnel junction. The current injected into the second spacer layer is confined by the tunnel junction to reach the active layer, which reduces the increase of the parasitic resistance of the device. The high-resistive region around the tunnel junction reduces the parasitic capacitance of the device.

8 Claims, 4 Drawing Sheets

VERTICAL CAVITY SURFACE EMITTING LASER DIODE AND A METHOD FOR PRODUCING THE SAME

BACKGROUND OF THE INVENTION

1. Field of the Invention

The present invention relates to a vertical cavity surface emitting laser diode (hereafter denoted as VCSEL) and a method to produce the VCSEL.

2. Related Prior Arts

Lear et al. has disclosed, in IEEE Photonics technology letters, vol. 6(7), pages 778-781, (1994), a type of VCSEL that is processed by the ion-implantation technique. Specifically, the VCSEL disclosed therein provides, on a GaAs substrate, a mirror made of 33 periods of n-type AlGaAs layers, an active layer including 3 well layers, and another mirror made of 22 periods of p-type AlGaAs layers. Further, the VCSEL above provides, on the p-type mirror, an electrode with a circular aperture. The outer region of the circular electrode is ion-implanted to secure the high-resistance of the p-type mirror layer.

SUMMARY OF THE INVENTION

One aspect of the present invention relates to a structure of a VCSEL. The VCSEL of the present invention comprises; a first DBR, an active layer, a first spacer layer, a tunnel junction, a second spacer layer and a second DBR. The first spacer layer includes a first area and a second area surrounding the first area. The tunnel junction processed so as to form a mesa is provided on the first area of the first spacer layer. The second spacer layer buries the mesa of the tunnel junction. The second DBR overlaps with the first area of the first spacer layer and the mesa of the tunnel junction. A feature of the present VCSEL is that the second area of the first spacer layer shows the high resistance, that is, the resistance of the second area of the first spacer layer is higher than that of the first area of the first spacer layer.

According to the arrangement of the VCSEL of the invention, the current injected in the second spacer layer, confined by the tunnel junction, and passed through the first area of the first spacer layer, reaches the active layer without flowing in the second DBR, which may reduce the parasitic resistance of the VCSEL.

The tunnel junction may convert the majority carrier flown through the junction; accordingly the first spacer layer and the second spacer layer have a different conduction type to each other. Because the second area of the first spacer layer shows the high resistance, the parasitic capacitance between the first and second spacer layers may be reduced.

The second spacer layer may include first and second areas. The first area of the second spacer layer overlaps with the first area of the first spacer layer and provides the second DBR thereon. The second area of the second spacer layer surrounds the first area. Moreover, only the second area of the first spacer layer has the resistance greater than the resistance of the second area of the second spacer layer. The VCSEL of the invention is unnecessary to make the second area of the second spacer layer high resistive, which makes it easy to form the VCSEL compared to a case where the second areas of both spacer layers are formed to be high-resistive.

The second area of the first spacer layer may be heavily implanted with at least one of hydrogen (H) and oxygen (O).

Another aspect of the invention relates to a method to form the VCSEL. The process comprises steps of: (a) forming a stack of semiconductor layers, which includes a first DBR, an active layer, a first spacer layer, and a tunnel junction; (b) forming a mesa including the tunnel junction by etching on a first area of the first spacer layer; (c) selectively implanting ions into a second area of the first spacer layer surrounding the first area thereof; and (d) forming a second spacer layer on the first and second areas of the first spacer layer so as to bury the mesa of the tunnel junction. Feature of the process is that the first spacer layer has a conduction type different from that of the second spacer layer, and only the second area of the first spacer layer shows high-resistance.

According to the method of the invention, the process perfumes is the ion-implantation in advance to form the second spacer layer, that is, the second spacer layer is not implanted at all, which enhances the controllability and the reproducibility of the distribution of the implanted ions. Moreover, because the whole second spacer layer may conduct the current injected therein, the parasitic resistance of the VCSEL may be reduced.

DESCRIPTION OF PREFERRED EMBODIMENTS

Next, the VCSEL of the invention and the process to produce the VCSEL will be explained as referring to accompanying drawings. In the description of the drawings, the same elements will be refereed by the same symbols or the same numerals without overlapping explanations.

Figure 1:
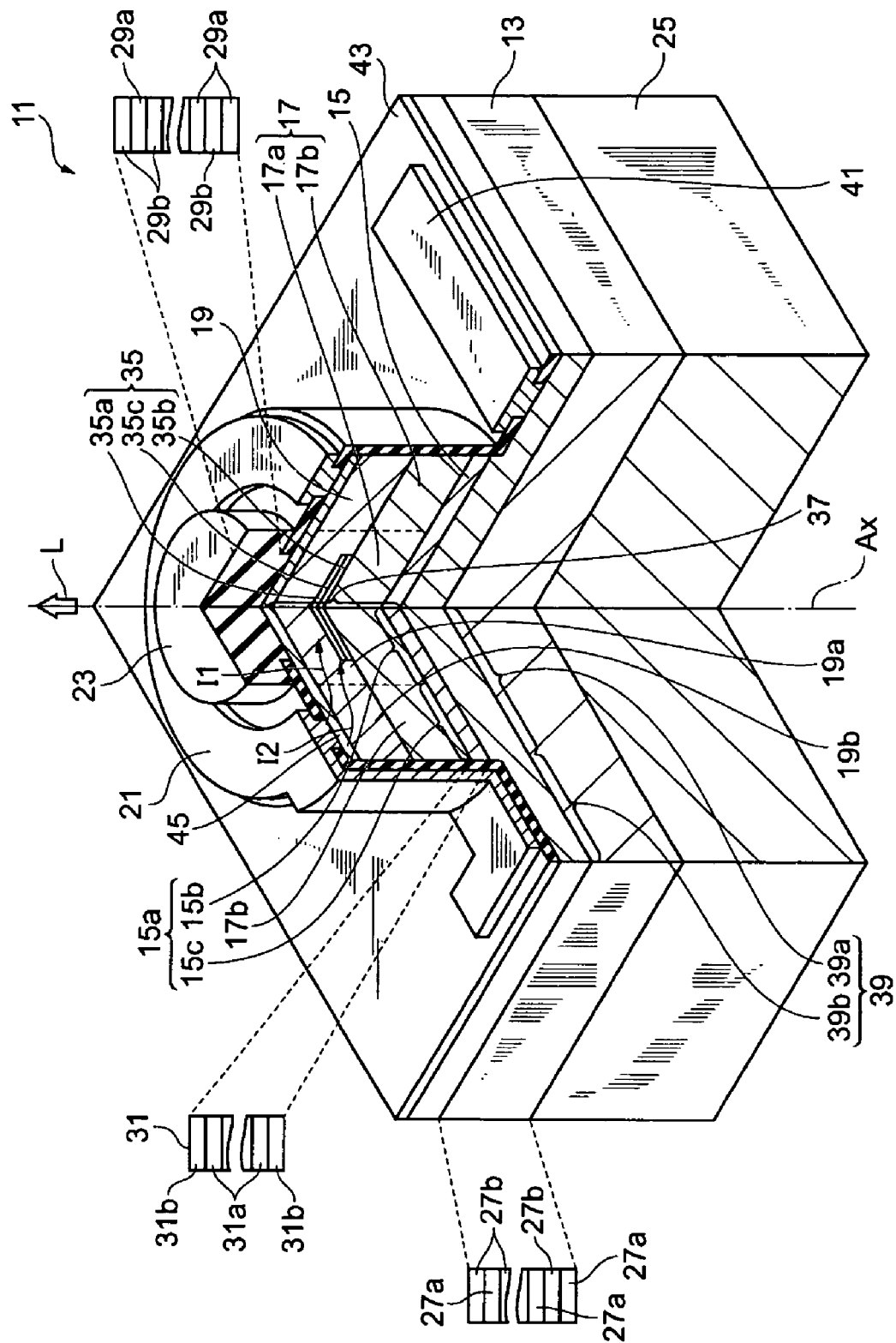
FIG. 1 is a perspective view, portion of which is cut away to show the layer stacking, of a VCSEL according to an embodiment of the present invention.

FIG. 1 is a schematic perspective view, a portion of which is broken to show the layer stacking, of the VCSEL according to an embodiment of the present invention. The VCSEL 11 provides the first distributed Bragg reflector (hereafter denoted as DBR) 13, the active layer 15, the first spacer layer 17, the second spacer layer 19, the first electrode 21, and the second DBR 23. The first DBR 13 is a stack of semiconductor materials formed on a semiconductor substrate 25. The active layer 15, which is formed on the first DBR 13, provides first and second areas, 15b and 15c, in the primary surface 15a thereof. The second area 15c surrounds the first area 15a. The first spacer layer 17, the second spacer layer 19 and the first electrode 21 are stacked on the active layer 15 in this order. The second DBR 23 is formed on the second spacer layer 19 and on the first area 15b of the active layer 15. A portion of the first spacer layer, which is the first area 17a, overlaps with the first area 15b of the active layer 15, while another portion 17b of the first spacer layer, which is the second area 17b, overlaps with the second area 15c of the active layer 15.

In the VCSEL 11, because the second area 17b has the resistance greater than that of the first area 17a, carriers or a current injected into the first electrode 21 spreads within the second spacer layer 19 without flowing in the second DBR, which suppresses the increase of the parasitic resistance of the VCSEL. Then, the current may be concentrated within the first area 17a.

The first DBR includes a plurality of first semiconductor layers 27a and a plurality of second semiconductor layers 27b alternately stacked to each other. The refractive index of first layers 27a is different from that of the second layers 27b. The second DBR 23 includes a plurality of first layers 29a and a plurality of second layers 29b also alternately stacked to each other. The first and second layers, 29a and 29b, in the second DBR 23 have refractive indices different from each other. The active layer 15 may provide the quantum well structure comprising a plurality of well layers 31a and a plurality of barrier layers 31b also alternately stacked to each other.

The VCSEL 11 may further provide the tunnel junction 35 in the mesa which overlaps with the first area 15b of the active layer 15. The second spacer layer 19 buries this mesa with the tunnel junction 35. Thus, the carriers spreading within the second spacer layer 19 reaches the tunnel junction 35.

The position and the shape of the tunnel junction 35 define the confinement of the carriers from the electrode 21 and the distribution thereof. The carriers reaching the tunnel junction 35 may convert their majority type thereat, for instance, when the electrons are provided from the electrode 21, the tunnel junction converts these electrons into holes. Thus converted carriers may recombine with the other carriers provided from the other electrode 41 in the active layer 15 to emit the light. The light thus generated in the active layer may become the coherent laser light L by running between the first and second DBRs, 13 and 23, because the laser cavity is formed between these two DBRs, 13 and 23.

The second spacer layer may include the first and second areas, 19a and 19b. The first area 19a overlaps with the first area 15b of the active layer 15, while, the second area 19b is formed on the second area 15c of the active layer. The resistance $R2_{17}$ of the second area 17b of the first spacer layer is greater than the resistance $R1_{19}$ and that $R2_{19}$ of the first and second areas, 19a and 19b, respectively, of the second spacer layer 19. The first electrode 21 is provided on the second area 19b of the second spacer layer 19.

The VCSEL 11 is unnecessary to provide an area with the high resistance extending both of second areas, 17b and 19b, of the first and second spacer layers, respectively. Because the first and second spacer layers, 17 and 19, are obtained through the epitaxial growth, the process to make the second area 17b of only the first spacer layer 17 high-resistive becomes simple compared to a case where both the first and second spacer layers provide the high-resistive portion in the second areas thereof.

The ion-implantation may make the semiconductor layer, which is epitaxially grown, high-resistive. The second area 17b of the present VCSEL 11 contains at least one of hydrogen (H) and oxygen (O) implanted therein to make the area high-resistive. Because the subsequent processes accompanied with thermal treatment over several hundred degrees centigrade may recover the damage induced by the ion-implantation, no thermal treatment subsequent to the ion-implantation is preferable, which also restrains the diffusion of doped atoms in the tunnel junction 35.

The VCSEL 11 may further provide the third spacer layer 39 on the first DBR 13 and including first and second areas, 39a and 39b. The second area 39b surrounds the first area 39a and provides the second electrode 41 thereon. The active layer 15 overlaps with the first area 39a. Then, the carriers injected from the second electrode 41 reaches the active layer 15 through the second area 39b and the first area 39a of the third spacer layer 39. Because no carriers from the electrode 41 flow in the first DBR 13, the materials in the first DBR 13 are unnecessary to be doped, which does not degrades the optical characteristics thereof such as an increase of the absorption due to the doped impurities.

The VCSEL 11 further provides the mesa 37 including the active layer 15, the first spacer layer 17, the tunnel junction 35 and the second spacer layer 19. The mesa 37 may provide a contact layer 45 on the second spacer layer 19, to which the first electrode 21 comes in contact.

The top and side of the mesa 37, and the top of the third spacer layer 39 are covered with the insulating film 43 with first to third openings. The first opening is formed on the second area 39b of the third spacer layer 39; the second opening is on a center portion of the mesa 37; and the third opening is formed on the top of the mesa 37 so as to surround the second opening. The second electrode 41 comes in contact with the second area 39b through the first opening; while, the first electrode 21 comes in contact with the contact layer through the third opening. The second DBR 23 is in the second opening.

Thus, the present embodiment provides a type of the VCSEL with reduced parasitic resistance.

It is inevitable to reduce the parasitic capacitance and the parasitic resistance, in addition to confine the current effectively within a desirable sized region, in order to operate the VCSEL in high speed. The conventional VCSEL such as those disclosed in the prior art mentioned above confines the current by ion-implanting into the p-type DBR. Such arrangement makes the peripheral area of the p-type DBR high-resistive and the current is forced to flow within a narrow center area of the p-type DBR, which increases the parasitic resistance of the device. Moreover, this process requests that the p-type DBR, which stacks a plurality of semiconductor layers and has a substantial thickness, is implanted in a whole thickness thereof. The process condition or the process tolerance of the ion-implantation becomes severe as the layer to be implanted becomes thicker.

A process using the ion-implantation for the VCSEL with the tunnel junction may be considered, where the ion-implantation is carried out after the growth of the active layer once unloading the wafer on which the active layer is grown from the growth furnace. This process may secure the controllability of the implantation regarding to the implanted depth. After the implantation, the tunnel junction is grown on the active layer in the subsequent step.

However, it is well known in the field that the ion-implantation induces the hard damage in the mother crystal to be implanted and it is quite hard to re-grow the semiconductor layer on the implanted region with good morphology and with good crystal quality. Thus, the process thus described, although the control of the ion-implantation, in particular, the ion-implanted depth thereof, may be secured, the tunnel junction with good junction interface cannot be obtained. Moreover, the region to confine the current is solely determined by the ion-implantation in this process, while, the accuracy of the physical dimension, for instance, a diameter of the current confinement region, by the ion-implantation is generally inferior to that of a combination of the photolithography and the etching to form the mesa for the tunnel junction.

Accordingly, the VCSEL of the invention is formed by the sequence; first, the mesa including the tunnel junction is formed by the photolithography and the etching after growing layers for the tunnel junction. Second the ion-implantation is carried out in the region except for the mesa. According to this process, the tunnel junction may be escaped from the damage caused by the implantation and the controllability of the implantation, especially, a depth of the implantation, may be secured by carrying out the implantation before the mesa is buried.

In this process, the current confinement may be performed by the mesa of the tunnel junction, while, the high resistive region is formed by the ion-implantation to decrease the parasitic capacitance. Moreover, the spacer layer that buries the mesa is free from the implantation, which may suppress the increase of the parasitic resistance due to the current expanding horizontally within the spacer layer. The process of the present invention degrades the crystal quality of the spacer layer, in particular, a portion grown on the implanted region. However, because the spacer layer in an implanted portion thereof does not include the structures with good crystal quality such as the tunnel junction and the active layer, the performance of the VCSEL thus processed may be uninfluenced.

Next, a process to form the VCSEL will be described in more detail as referring to FIGS. 2 to 4. In the process, the semiconductor layers are grown by the conventional Organic Metal Vapor Phase Epitaxy (OMVPE) technique.

Figure 2A:
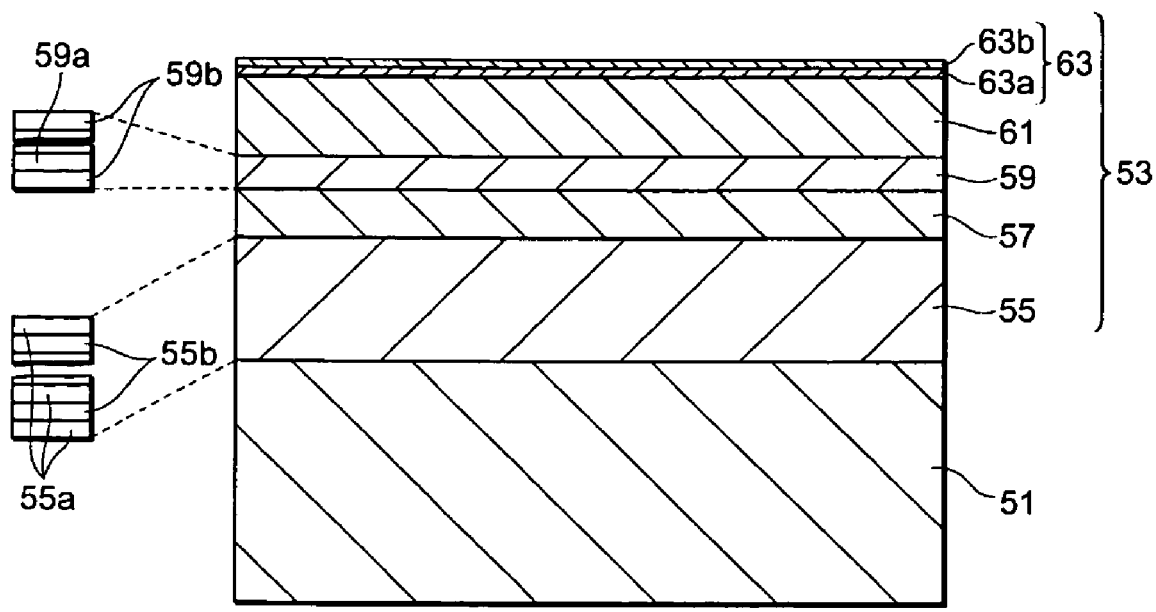
FIG. 2A is a cross section to illustrate a process step to form the VCSEL.

First, the process grows a stack of semiconductor layers 53 on a semiconductor substrate 51, for instance, a semi-insulating GaAs substrate, as shown FIG. 2A. The layers 53 includes a multi-layer 55 for the first DBR, a third spacer layer 57, an active layer 59, a first spacer layer 61, and a tunnel junction 63. The multi-layer 55 comprises 32 pairs of an un-doped GaAs 55$a$ with $Al_{0.9}Ga_{0.1}As$ 55$b$. The third spacer layer 57 is an n-type GaAs doped with silicon (Si), the active layer 59 comprises three pairs of an $In_{0.2}Ga_{0.8}As$ well 55$a$ with a GaAs barrier 55$b$, the first spacer layer 61 is a p-type GaAs doped with carbon (C), and the tunnel junction 63 comprises a $p^{++}$-InGaAs 63$a$ heavily doped with carbon (C) and a $n^{++}$-InGaAs 63$b$ heavily doped with silicon (Si). The hole concentration in the $p^{++}$-InGaAs layer 63$a$ reaches, for instance, $1 \times 10^{19}$ cm$^{-3}$, and the thickness thereof is about 10 nm. While, the electron concentration in $n^{++}$-InGaAs layer 63$b$ is, for instance, $5 \times 10^{18}$ cm$^{-3}$ and the thickness thereof is about 10 nm.

Figure 2B:
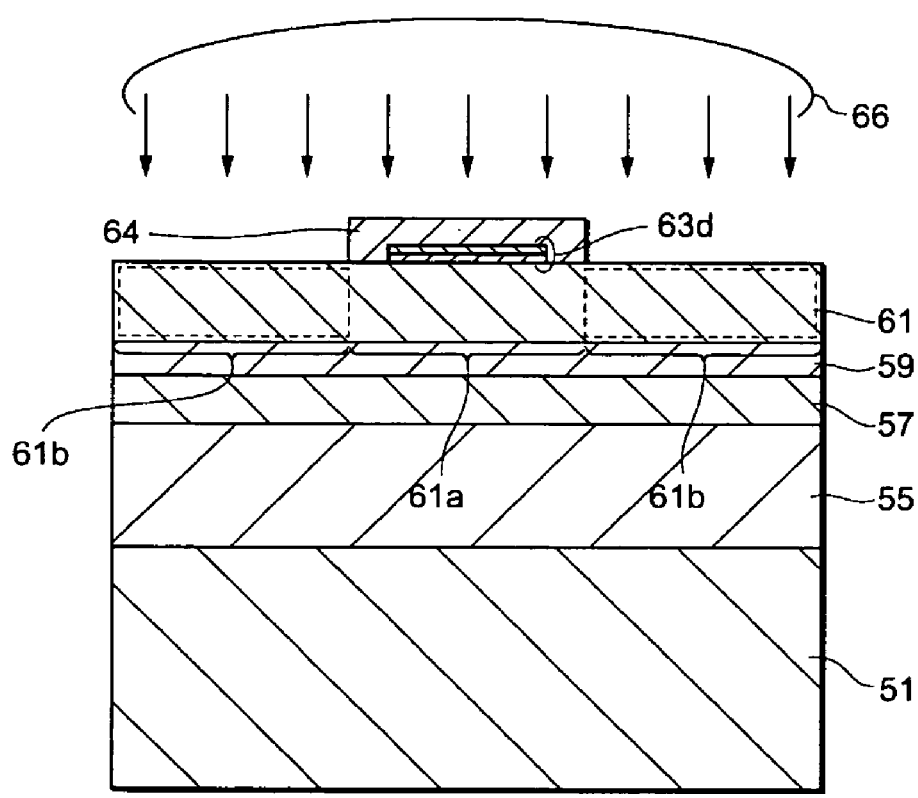
FIG. 2B is a cross section of a process step subsequent to the process shown in FIG. 2A.

Next, a resist mask with a diameter of 5 μm is formed on the stacked layer 53 by the photolithography to form the mesa. The wet etching using this resist mask forms the mesa including the tunnel junction 63$d$, as illustrated in FIG. 2B. Thus, the mesa of the tunnel junction 63$d$ is formed on the first spacer layer 61. The thickness of the first spacer layer 61 may be 0.25 μm. The first spacer layer 61 includes a first portion 61$a$ providing an area to flow the current therein and a second are 61$b$ to be ion-implanted around the first area 61$a$.

The mask 64 is formed so as to cover the first area 61$a$ and the mesa 63$d$. The mask 64 may be a photo resist with a thickness of about 5 μm and a circular shape with a diameter of about 15 μm. The mask 64 overlaps the mesa 63$d$, namely, the center of the mask 64 substantially coincides with the center of the mesa 64$d$. The ion-implantation 66 is carried out in the second area 61$b$ by using the mask 64. The area surrounded by the dot line in FIG. 2B corresponds to the area to be ion-implanted. Hydrogen ions (H) may be used for the implantation. The acceleration voltage and the dose of the implantation may be 50 keV and $1 \times 10^{15}$ cm$^{-2}$, respectively, and the range of the implanted ions becomes about 250 nm from the surface of the first spacer layer 61. Only the second area 61$b$ is implanted by the mask 64 with the 5 μm thick. Oxygen (O) may be used as the implanted ions. The mask 64 is removed after the completion of the ion implantation. It is preferable not to carry out the annealing in a high temperature to suppress the re-configuration of the implanted ions.

Figure 3A:
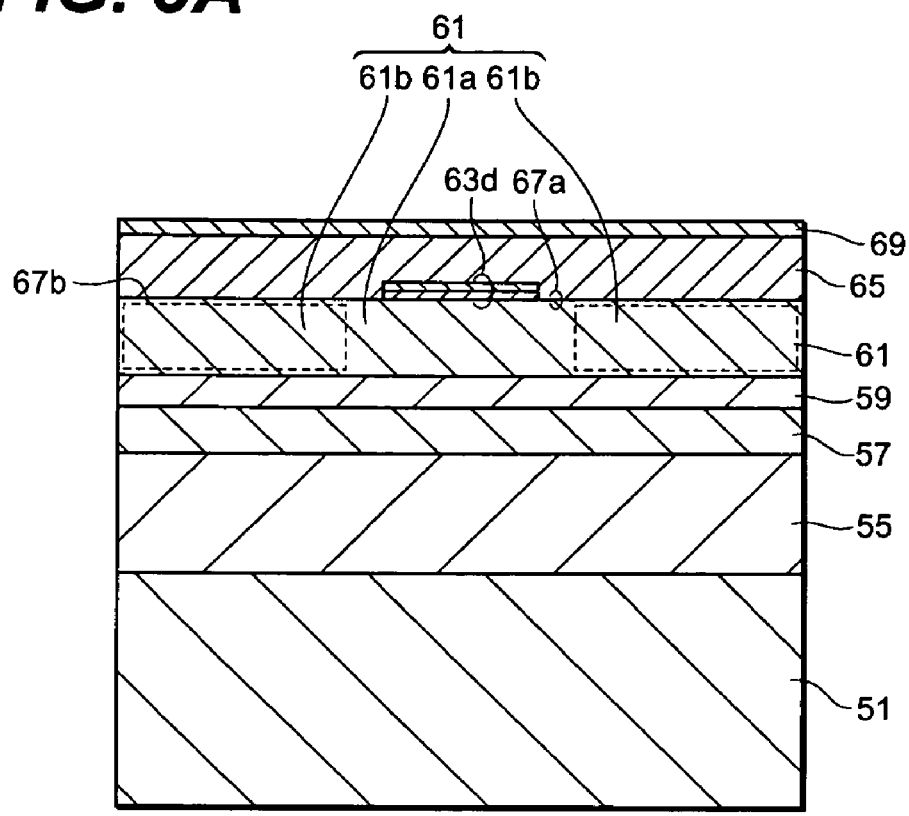
FIG. 3A is a cross section to illustrate a process step subsequent to that shown in FIG. 2B.
Figure 3B:
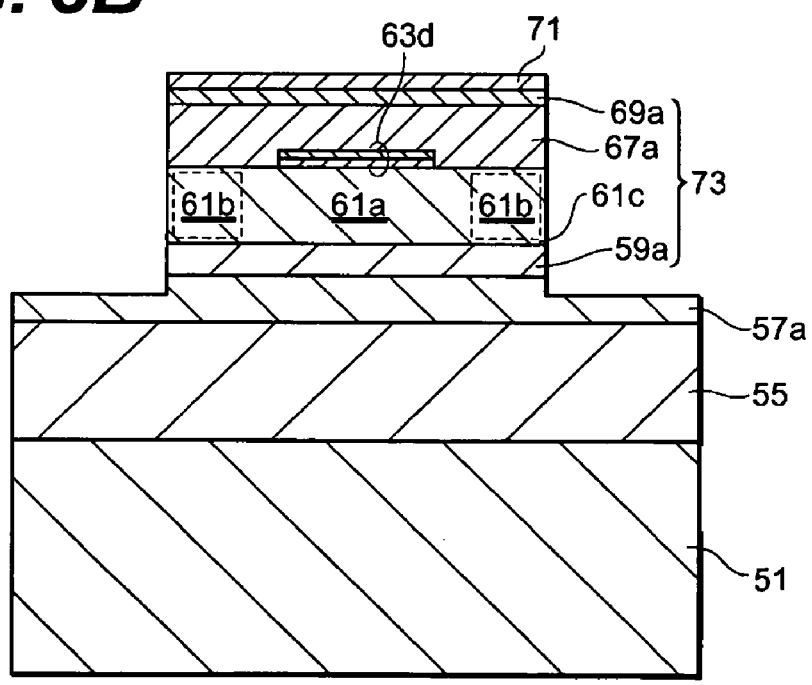
FIG. 3B is a cross section of the device to illustrate a process step subsequent to that shown in FIG. 3A.
Figure 4A:
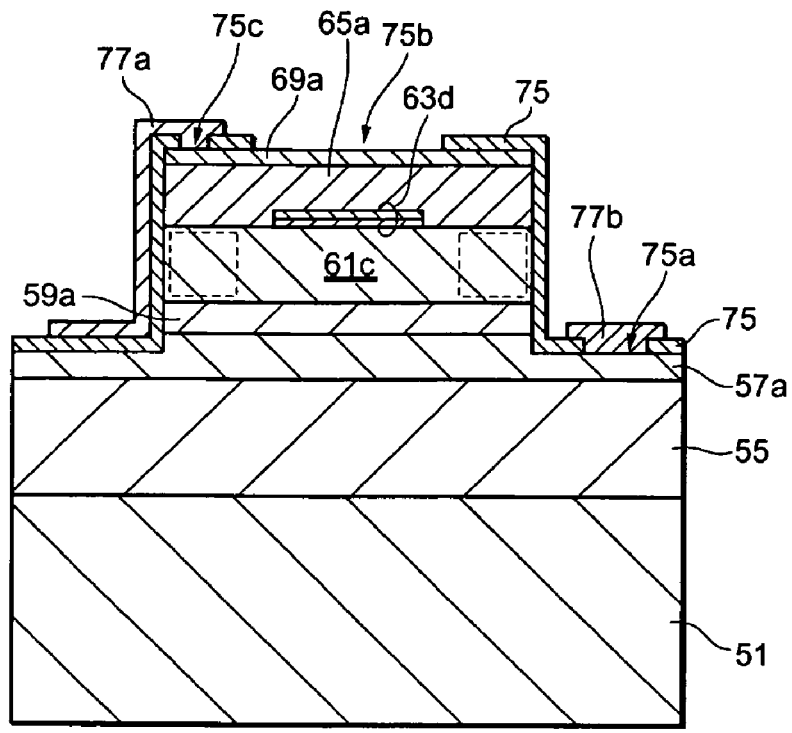
FIG. 4A is a cross section to illustrate a process step subsequent to that shown in FIG. 3B.
Figure 4B:
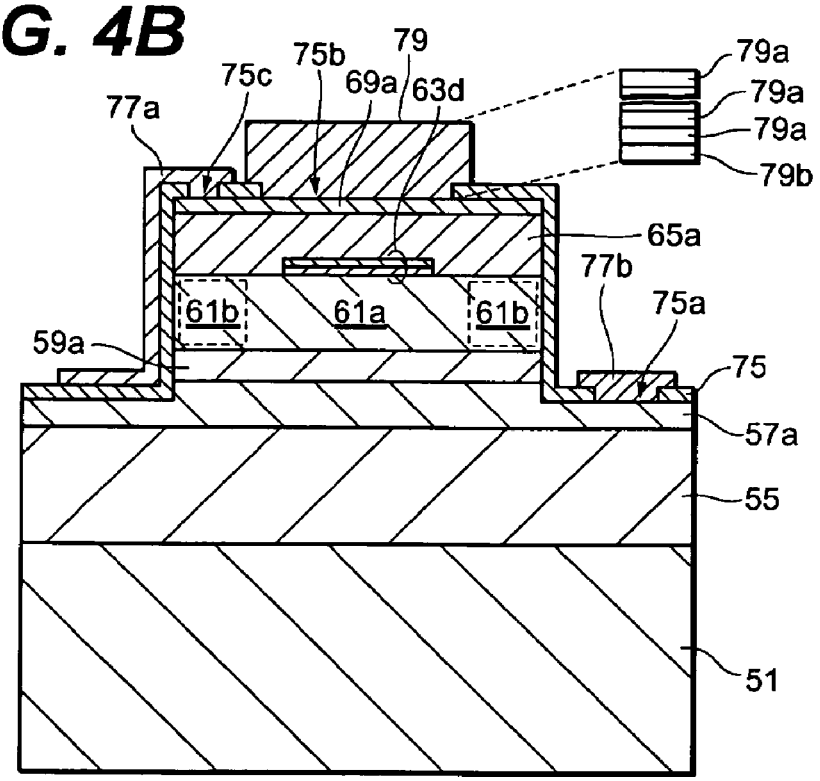
FIG. 4B is a cross section to illustrate a process step subsequent to that shown in FIG. 4A.

The substrate 51 with thus processed layers, 55 to 63, is set again within the growth chamber to grow the second spacer layer 65 by a thickness of about 0.5 μm on the first spacer layer 61 and the mesa, as shown in FIG. 3A. The mesa of the tunnel junction 63$d$ is thus buried by the second spacer layer 65. This second spacer layer 65 is made of, for instance, GaAs doped with silicon (Si). The conducting type of this second spacer layer 65 is different from that of the first spacer layer 61. That is, the second spacer layer 65 forms a first junction 67$a$ with the first spacer layer 61 in the first area 61$a$, while, the second spacer layer 65 forms a second junction 67$b$ with the first spacer layer 61 in the second area 61$b$. The first junction 67$a$ around the tunnel junction 63$d$ becomes a p-n junction. When a reverse bias is applied between electrodes, 21 and 41, to operate the VCSEL 11, the current injected into the first electrode 21 spreads within the second spacer layer 65, then confined in the tunnel junction 63$d$.

The process subsequently grows a contact layer 69 on the second spacer layer 65. This contact layer 69 is, for instance, GaAs doped with silicon (Si) and has a thickness of about 0.1 μm, as shown in FIG. 3A.

Next, on the contact layer 69 is formed with a mask 71 to form a mesa 73 for the second DBR. The mask 71, may be made of photo resist, has a diameter of about 30 μm. The dry-etching may form the mesa 73 by using the mask 71. The mesa with a pillar-shape involves the contact layer 69$a$, the second spacer layer 65$a$, the tunnel junction 63$d$, the first spacer layer 61$c$, the active layer 59$a$, and the third spacer layer 57$a$. A portion of the third spacer layer 57$a$ exposes a surface thereof around the mesa 73. The center of the mesa 73 substantially coincides with the center of the tunnel junction 63$d$.

Next, an insulating film 75 covers the top and sides of the mesa 73 and the top surface of the third spacer layer 57$a$. The insulating film 75 may be an inorganic material containing silicon, such as silicon dioxide ($SiO_2$). This film 75 provides openings, 75$a$ to 75$c$, on the surface of the third spacer layer 57$a$, on the top center of the mesa 73, and on the top of the mesa 73 and surrounding the former opening, respectively. The anode and cathode electrodes, 77$a$ and 77$b$, are formed by the evaporation of metals. The cathode electrode 77$b$ comes in contact with the third spacer layer 57$b$ through the first opening 75$a$, while, the anode electrode 77$a$ is in contact with the contact layer 69$a$ through the third opening 75$c$.

On the top of the mesa 73 is formed with the second DBR 79 made of multi-layered dielectric films. The second DBR 79 includes, for instance, a plurality of silicon dioxide 79$a$ ($SiO_2$) and titanium dioxide 79$b$ ($TiO_2$) alternately stacked each other. This second DBR 79 positions on the second opening 75$b$, that is, the first dielectric of the second DBR 79 comes in contact with the contact layer 69$a$ through the second opening 75$b$.

Thus formed VCSEL 11 has a parasitic resistance of about 50Ω, while, the VCSEL disclosed in the prior art mentioned above seems to have a parasitic resistance of about 170Ω. Because the conventional VCSEL shown in the prior art processes the ion-implantation from the uppermost surface thereof, the range of the implanted ions, in particular, the depth distribution of the implanted ions becomes quite hard to be controlled. The current from the anode electrode to the active layer bypasses the area with high-resistance formed by the ion-implantation and flows in a narrow path within the p-type DBR, which is a reason to increase the parasitic resistance of the device. Moreover, as mentioned above, the implanted ions are hard to be precisely controlled in the depth thereof, which degrades the re-productivity of the area with the high-resistance.

On the other hand, the VCSEL according to the present invention performs the ion-implantation before the burying of the tunnel junction by the spacer layer, which makes it possible to implant ions relatively shallower; accordingly, the process becomes stable and reproducible. Moreover, the VCSEL of the invention provides (1) the second spacer layer burying the tunnel junction with no high-resistive area, which may reduce the parasitic resistance of the device, (2) the tunnel junction which may confines the current, and (3) the first spacer layer with the high-resistive area formed by the ion-implantation which may reduce the parasitic capacitance of the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A vertical cavity surface emitting laser diode (VCSEL), comprising:
    a first distributed Bragg reflector;
    an active layer provided on said first DBR;
    a first spacer layer provided on said active layer, said first spacer layer including a first area and a second area surrounding said first area;
    a tunnel junction provided on said first area of said first spacer layer;
    a second spacer layer provided on said first spacer layer so as to bury said tunnel junction; and
    a second distributed Bragg reflector provided on said second spacer layer so as to overlap with said tunnel junction and said first area of said first spacer layer,
    wherein said second area of said first spacer layer has resistance greater than resistance of said first area of said first spacer layer.

2. The VCSEL according to claim 1,
    wherein said first spacer layer has a conduction type different from a conduction type of said second spacer layer.

3. The VCSEL according to claim 1,
    wherein said tunnel junction forms a mesa on said first area of said first spacer layer.

4. The VCSEL according to claim 1,
    wherein said second spacer layer includes a first area to provide said second distributed Bragg reflector thereon and a second area surrounding said first area of said second spacer layer to provide an electrode thereon,
    wherein said first area of said second spacer layer overlaps with said first area of said first spacer layer.

5. The VCSEL according to claim 4,
    wherein said second area of said first spacer layer has resistance greater than resistance of said second area of said second spacer layer.

6. The VCSEL according to claim 1,
    wherein said second area of said first spacer layer is heavily implanted with at least one of hydrogen (H) and oxygen (O).

7. The VCSEL according to claim 1,
    further comprising a third spacer layer between said first distributed Bragg reflector and said active layer,
    wherein said third spacer layer includes a first area formed so as to overlap with said first area of said first spacer layer and a second area surrounding said first area of said third spacer layer to form an electrode thereon.

8. A VCSEL comprising:
    a semi-insulating GaAs substrate;
    a first DBR including a plurality of un-doped GaAs layers and a plurality of un-doped AlGaAs layers alternately stacked to each other;
    an active layer including a plurality of pairs of InGaAs and GaAs;
    a first spacer layer made of p-type GaAs doped with carbon, said first spacer layer including a first area and a second area surrounding said first area;
    a tunnel junction including a p-type InGaAs heavily doped with carbon and an n-type InGaAs heavily doped with silicon, said tunnel junction forming a mesa provided on said first area of said first spacer layer;
    a second spacer layer made of n-type GaAs doped with silicon, said second spacer layer being formed on said first spacer layer so as to bury said mesa of said tunnel junction; and
    a second DBR provided so as to overlap said first area of said first spacer layer, said second DBR including a plurality of silicon dioxide and titanium dioxide alternately stacked to each other.

* * * * *